US012740226B2

(12) United States Patent
Lim et al.

(10) Patent No.: US 12,740,226 B2

(45) Date of Patent: Sep. 15, 2026

(54) DISPLAY DEVICE HAVING INORGANIC PROTECTION LAYER SURROUNDING A SURFACE OF QUANTUM DOT

(71) Applicant: LG Display Co., Ltd., Seoul (KR)

(72) Inventors: KiSung Lim, Paju-si (KR); JinSu Moon, Paju-si (KR); MyungWon Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 362 days.

(21) Appl. No.: 18/235,221

(22) Filed: Aug. 17, 2023

(65) Prior Publication Data

US 2024/0164127 A1 May 16, 2024

(30) Foreign Application Priority Data

Nov. 14, 2022 (KR) ........................ 10-2022-0151767

(51) Int. Cl.

*H10K 50/115* (2023.01)
*H10K 59/38* (2023.01)
*H10K 59/80* (2023.01)
*H10K 102/00* (2023.01)

(52) U.S. Cl.

CPC ........... *H10K 50/115* (2023.02); *H10K 59/38* (2023.02); *H10K 59/8792* (2023.02); *H10K 2102/351* (2023.02)

(58) Field of Classification Search

CPC ... H10K 50/115; H10K 59/38; H10K 59/8792
See application file for complete search history.

(56) References Cited

U.S. PATENT DOCUMENTS 11,917,885 B2 2/2024 Bae et al.
12,382,813 B2 8/2025 Seong et al.
2019/0229153 A1 7/2019 Park et al.
2021/0328172 A1* 10/2021 Joo .................... H10K 50/8428
2022/0077239 A1* 3/2022 Kim .................. G02F 1/133512
2022/0077354 A1* 3/2022 Kim ....................... C09K 11/70
2022/0137273 A1* 5/2022 Han ......................... G02B 5/22 359/885
2023/0209962 A1* 6/2023 Seong .................. H10K 59/877 257/40

FOREIGN PATENT DOCUMENTS

KR 10-2018-0013258 2/2018
KR 10-2019-0090113 8/2019
KR 10-2021-0099242 8/2021
KR 10-2021-0137810 11/2021

* cited by examiner

*Primary Examiner* — Michael Jung
(74) *Attorney, Agent, or Firm* — PnK IP LLC

(57) ABSTRACT

A display device includes a substrate; a light emitting element disposed on the substrate; and a photoconversion layer disposed on the light emitting element and including a photoconversion structure body, of which a viewing angle and color purity are improved by preventing degradation of the quantum dot according to moisture and oxygen in accordance with the photoconversion structure body including a quantum dot and an inorganic protection layer coating a surface of the quantum dot in the photoconversion layer may be provided.

20 Claims, 15 Drawing Sheets

DISPLAY DEVICE HAVING INORGANIC PROTECTION LAYER SURROUNDING A SURFACE OF QUANTUM DOT

CROSS-REFERENCE TO RELATED APPLICATION

This application claims the priority of Korean Patent Application No. 10-2022-0151767, filed on Nov. 14, 2022, which is hereby incorporated by reference in its entirety.

BACKGROUND

Field of the Disclosure

The present disclosure relates to a display device.

Description of the Background

Display devices are widely used in display screens of laptop computers, tablet computers, smartphones, mobile display devices, mobile information devices, and the like in addition to display devices of television sets and monitors.

Examples of display devices include a liquid crystal display device (LCD), an organic light emitting display device (OLED), and the like. Recently, flat panel display devices in which micro-light emitting diodes (LEDs) having a size of 100 μm or less are applied to pixels have been proposed as well.

As methods for driving such display devices, a method in which light emitting elements emitting red light, green light, and blue light are formed in red, green, and blue subpixels and are configured to individually emit light, a method in which mutually-different color filters are applied to red, green, and blue subpixels, light generated from a light source is caused to pass through the color filters, and thus light of colors corresponding to the subpixels is implemented, and the like are used.

In a case in which micro-LEDs of an individual emission type are used, there is a problem in that a color shift phenomenon of a red chip according to a viewing angle occurs due to intrinsic light distribution characteristics differences of a red chip and blue and green chips of the micro-LEDs.

In addition, in a case in which light sources generating blue light and a photoconversion layer including red quantum dots or green quantum dots is used, a barrier film is used for protecting the photoconversion layer.

However, there is a problem in that quantum dots are degraded due to penetration of moisture or oxygen into the photoconversion layer and irreversible reactions thereof with quantum dots.

SUMMARY

Accordingly, the present disclosure is to provide a display device that solves a color shift phenomenon of a red chip by introducing a photoconversion structure body including quantum dots and an inorganic protection layer coating the surface of the quantum dots into a photoconversion layer and improving a viewing angle and color purity by preventing degradation of quantum dots due to moisture and oxygen while minimizing use of a barrier film.

The present disclosure is also to provide a display device capable of improving a viewing angle and color purity by solving a color shift phenomenon according to red chips.

The present disclosure is also to provide a display device capable of improving a viewing angle and color purity by preventing degradation of quantum dots due to moisture and oxygen.

The present disclosure is also to provide a display device capable of reducing a manufacturing cost by minimizing use of a barrier film in a photoconversion layer.

In an aspect of the present disclosure, a display device includes a substrate, a light emitting element disposed on the substrate, and a photoconversion layer disposed on the light emitting element and including a photoconversion structure body, wherein the photoconversion structure body may include a quantum dot, and an inorganic protection layer coating a surface of the quantum dot.

Various aspects of the present disclosure provides a display device including a substrate including a plurality of subpixel regions; a light emitting element disposed on the substrate and emitting light of a first wavelength band; and a photoconversion layer disposed on the light emitting element.

In aspect of the present disclosure, the photoconversion layer include a first photoconversion layer including a first photoconversion structure body converting light of the first wavelength band into light of a second wavelength band in a first subpixel region; and a second photoconversion layer including a second photoconversion structure body converting light of the first wavelength band into light of a third wavelength band in a second subpixel region.

In aspects of the present disclosure, the first photoconversion structure body includes a first quantum dot and a first inorganic protection layer coating a surface of the first quantum dot, and the second photoconversion structure body may include a second quantum dot of which a size is different from that of the first quantum dot and a second inorganic protection layer coating a surface of the second quantum dot.

According to aspects of the present disclosure, a display device of which a viewing angle and color purity are improved by solving a color shift phenomenon of a red chip and preventing degradation of the quantum dots according to moisture and oxygen while minimizing use of a barrier film may be provided.

According to aspects of the present disclosure, a display device that solves a color shift phenomenon of a red chip by including a photoconversion structure body including quantum dots and an inorganic protection layer coating the surface of the quantum dots in the photoconversion layer may be provided.

According to aspects of the present disclosure, by including a photoconversion structure body including quantum dots and an inorganic protection layer coating the surface of the quantum dots in the photoconversion layer, a display device preventing degradation of the quantum dots according to moisture and oxygen may be provided.

According to aspects of the present disclosure, by including a photoconversion structure body including quantum dots and an inorganic protection layer coating the surface of the quantum dots in the photoconversion layer, a display device capable of reducing a manufacturing cost by minimizing use of a barrier film in the photoconversion layer may be provided.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
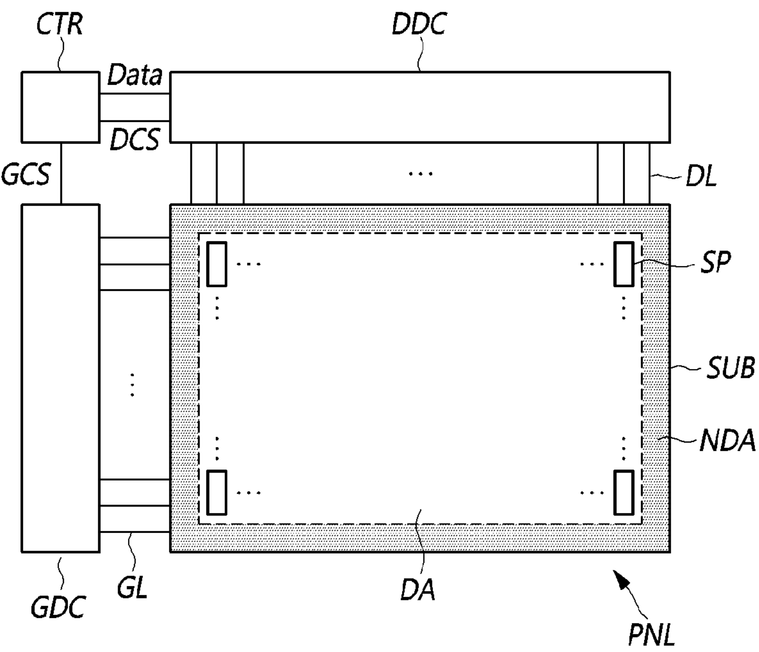
FIG. 1 is a system configuration diagram of a display device according to aspects of the present disclosure.

In the following description of examples or aspects of the present disclosure, reference will be made to the accompanying drawings in which it is shown by way of illustration specific examples or aspects that may be implemented, and in which the same reference numerals and signs may be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only may the first element "be directly connected or coupled to" or "directly contact or overlap" the second element, but a third element may also be "interposed" between the first and second elements, or the first and second elements may "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "may".

Hereinafter, various aspects of the present disclosure will be described in detail with reference to the attached drawings.

FIG. 1 is a system configuration diagram of a display device according to aspects of the present disclosure.

Referring to FIG. 1, the display device according to aspects of the present disclosure may include a display panel (PNL) and a drive circuit used for driving the display panel (PNL).

The drive circuit may include a data driving circuit (DDC), a gate driving circuit (GDC), and the like and may further include a controller (CTR) that controls the data driving circuit (DDC) and the gate driving circuit (GDC).

The display panel (PNL) may include a substrate (SUB) and signal lines (also referred to as wirings) such as multiple data lines (DL) and multiple gate lines (GL) disposed on the substrate (SUB). The display panel (PNL) may include multiple data lines (DL) and multiple subpixels (SP) connected to the multiple gate lines (GL).

The display panel (PNL) may include a display region (DA) in which a video is displayed and a non-display region (NDA), in which no video is displayed, positioned on an outer side of the display region (DA). In the display panel (PNL), multiple sub-pixels (SP) for displaying an image may be disposed in the display region (DA). In the non-display area (NDA), drive circuits (DDC, GDC, CTR) may be electrically connected, or the drive circuits (DDC, GDC, CTR) may be mounted, and a pad unit to which an integrated circuit, a printed circuit, or the like is connected may be disposed.

The data driving circuit (DDC) is a circuit used for driving multiple data lines (DL) and may supply data signals to the multiple data lines (DL). The gate driving circuit (GDC) is a circuit used for driving multiple gate lines (GL) and may supply gate signals to the multiple gate lines (GL). To control an operation timing of the data driving circuit (DDC), the controller (CTR) may supply a data control signal (DCS) to the data driving circuit (DDC). The controller (CTR) may supply a gate control signal (GCS) used for controlling an operation timing of the gate driving circuit (GDC) to the gate driving circuit (GDC).

The controller (CTR) may perform control such that a scanning operation starts in accordance with a timing implemented in each frame, convert input video data input from the outside into a data signal format used in the data driving circuit (DDC) and supply the converted video data (Data) to the data driving circuit (DDC), and perform control such that data driving progresses at an appropriate time in accordance with a scanning timing.

To control the gate driving circuit (GDC), the controller (CTR) may output various gate control signals (GCS) including a gate start pulse (GSP), a gate shift clock (GSC), a gate output enable signal (GOE), and the like.

To control the data driving circuit (DDC), the controller (CTR) may output various data control signals (DCS) including a source start pulse (SSP), a source sampling clock (SSC), a source output enable signal (SOE), and the like.

The controller (CTR) may be implemented using a component that is separate from the data driving circuit (DDC) or may be implemented as an integrated circuit by being integrated with the data driving circuit (DDC).

The data driving circuit (DDC) receives video data (Data) from the controller (CTR) and supplies data voltages to multiple data lines (DL), thereby driving the multiple data lines (DL). Here, the data driving circuit (DDC) is also referred to as a source driving circuit.

Such a data driving circuit (DDC) may include one or more source driver integrated circuits (SDIC).

For example, each source driver integrated circuit (SDIC) may be connected to the display panel (PNL) using a tape automated bonding (TAB) method, may be connected to a bonding pad of the display panel (PNL) using a chip on glass (COG) or chip on panel (COP) method, or may be implemented using a chip on film (COF) method and connected to the display panel (PNL).

The gate driving circuit (GDC) may output a gate signal of a turn-on level voltage or a gate signal of a turn-off level voltage in accordance with control of the controller (CTR). The gate driving circuit (GDC) may sequentially drive multiple gate lines (GL) by sequentially supplying a gate signal of the turn-on level voltage to multiple gate lines (GL).

The gate driving circuit (GDC) may be connected to the display panel (PNL) using a tape automated bonding (TAB) method, may be connected to a bonding pad of the display panel (PNL) using a chip on glass (COG) or chip on panel (COP) method, or may be connected to the display panel (PNL) using a chip on film (COF) method. Alternatively, the gate driving circuit (GDC) may be formed in the non-display region (NDA) of the display panel (PNL) as a gate in panel (GIP) type. The gate driving circuit (GDC) may be disposed on the substrate (SUB) or connected to the substrate (SUB). In other words, in the case of the GIP type, the gate driving circuit (GDC) may be disposed in the non-display region (NDA) of the substrate (SUB). In the case of the chip on glass (COG) type, the chip on film (COF) type, or the like, the gate driving circuit (GDC) may be connected to the substrate (SUB).

On the other hand, at least one of the data driving circuit (DDC) and the gate driving circuit (GDC) may be disposed in the display region (DA). For example, at least one of the data driving circuit (DDC) and the gate driving circuit (GDC) may be disposed not to overlap with the subpixels (SP) or be disposed to have a part or the whole thereof to overlap with the subpixels (SP).

When a specific gate line (GL) is open in accordance with the gate driving circuit (GDC), the data driving circuit (DDC) may convert video data (Data) received from the controller (CTR) into a data voltage of an analog form and supply the data voltage to multiple data lines (DL).

The data driving circuit (DDC) may be connected to one side (for example, an upper side or a lower side) of the display panel (PNL). Depending on a driving type, a panel design type, and the like, the data driving circuit (DDC) may be connected to both sides (for example, an upper side and a lower side) of the display panel (PNL) or may be connected to two or more side faces among four side faces of the display panel (PNL).

The gate driving circuit (GDC) may be connected to one side (for example, a left side or a right side) of the display panel (PNL). Depending on a driving type, a panel design type, and the like, the gate driving circuit (GDC) may be connected to both sides (for example, a left side and a right side) of the display panel (PNL) or may be connected to two or more side faces among four side faces of the display panel (PNL).

The controller (CTR) may be a timing controller used in a general display technology, may be a control device that includes a timing controller and may further perform another control function, or may be a control device other than a timing controller, or may be a circuit disposed inside a control device. The controller (CTR) may be implemented using various circuits and electronic components such as an integrated circuit (IC), a field programmable gate array (FPGA), an application specific integrated circuit (ASIC), a processor, and the like.

The controller (CTR) is mounted in a printed circuit board, a flexible printed circuit, or the like and may be electrically connected to the data driving circuit (DDC) and the gate driving circuit (GDC) through the printed circuit board, the flexible printed circuit, or the like.

A display device according to aspects of the present disclosure may be a display including a back light unit such as a liquid crystal display device and may be a self-emission display such as an organic light emitting diode (OLED) display, a quantum dot display, or a micro light emitting diode (LED) display.

In a case in which a display device according to aspects of the present disclosure is an OLED display, each subpixel (SP) may include an organic light emitting diode (OLED) that autonomously emits light as a light emitting element. In a case in which a display device according to aspects of the present disclosure is a quantum dot display, each subpixel (SP) may include a light emitting element formed using a quantum dot that is a semiconductor crystal emitting light. In a case in which a display device according to aspects of the present disclosure is an LED display, each subpixel (SP) may include a micro light emitting diode (LED) that autonomously emits light and is formed on the basis of an inorganic material as a light emitting element.

The display panel (PNL) according to aspects of the present disclosure may have either a top emission structure or a bottom emission structure and may have a dual emission structure in some cases.

Figure 2:
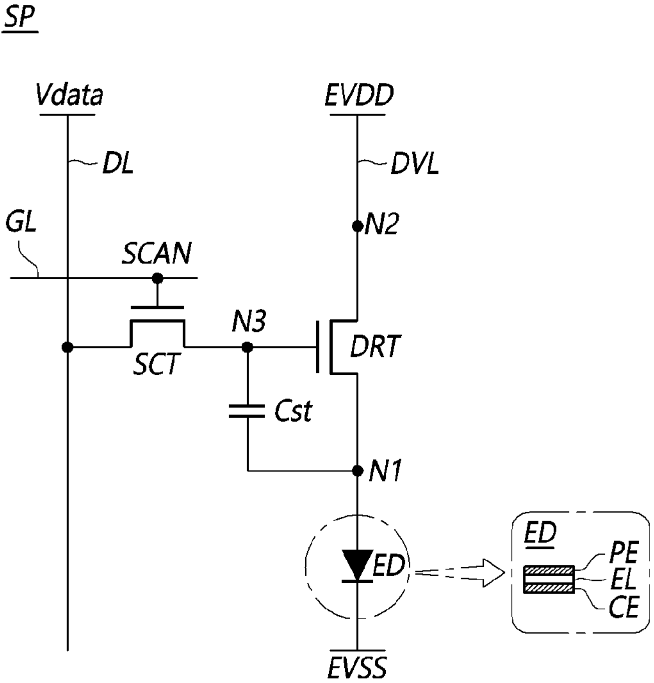
FIG. 2 is an equivalent circuit of a subpixel of a display device according to aspects of the present disclosure.
Figure 3:
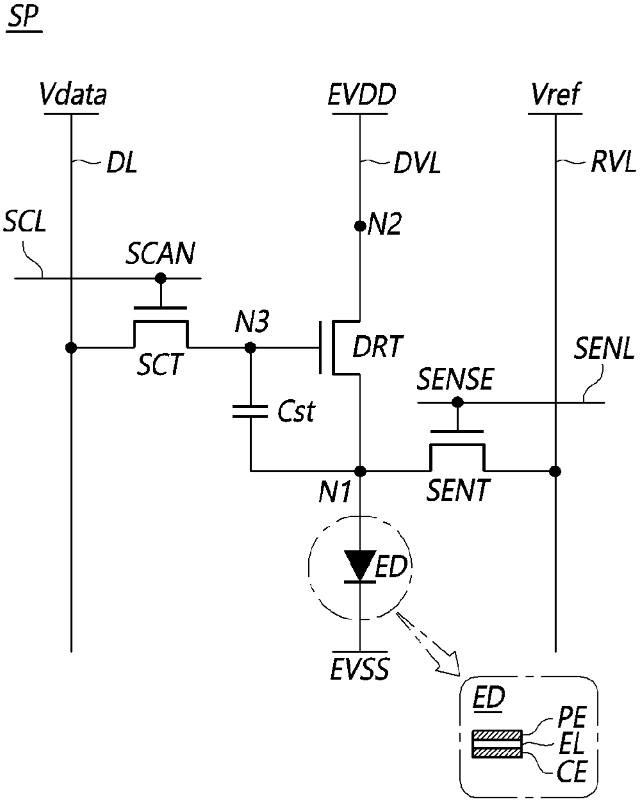
FIG. 3 is another equivalent circuit of a subpixel of a display device according to aspects of the present disclosure.

FIG. 2 is an equivalent circuit of a subpixel (SP) of the display device according to aspects of the present disclosure, and FIG. 3 is another equivalent circuit of a subpixel of the display device according to aspects of the present disclosure.

Referring to FIG. 2, each of multiple subpixels (SP) disposed in the display panel (PNL) of the display device according to aspects of the present disclosure may include a light emitting element (ED), a drive transistor (DRT), a scanning transistor (SCT), and a storage capacitor (Cst).

Referring to FIG. 2, the light emitting element (ED) includes a pixel electrode (PE) and a common electrode (CE) and may include a light emitting layer (EL) positioned between the pixel electrode (PE) and the common electrode (CE).

The pixel electrode (PE) of the light emitting element (ED) is an electrode that is disposed for each subpixel (SP), and the common electrode (CE) may be an electrode that is disposed to be common to all the subpixels (SP). Here, the pixel electrode (PE) may be an anode electrode, and the common electrode (CE) may be a cathode electrode. On the other hand, the pixel electrode (PE) may be a cathode electrode, and the common electrode (CE) may be an anode electrode.

For example, the light emitting element (ED) may be an organic light emitting diode (OLED), a light emitting diode (LED), a quantum dot light emitting element, or the like.

The drive transistor (DRT) is a transistor used for driving a light emitting element (ED) and may include a first node (N1), a second node (N2), a third node (N3), and the like. Here, the first node (N1) may be referred to as a first electrode, the second node (N2) may be referred to as a second electrode, and the third node (N3) may be referred to as a third electrode.

The first node (N1) of the drive transistor (DRT) may be a source node (source electrode) or a drain node (drain electrode) of the drive transistor (DRT) and may be electrically connected also to the pixel electrode (PE) of the light emitting element (ED). The second node (N2) of the drive transistor (DRT) may be a drain node (drain electrode) or a source node (source electrode) of the drive transistor (DRT) and may be electrically connected to a drive voltage line (DVL) that supplies a drive voltage (EVDD). The third node (N3) of the drive transistor (DRT) may be a gate node (gate electrode) of the drive transistor (DRT) and may be electrically connected to a source node or a drain node of the scanning transistor (SCT).

The scanning transistor (SCT) is controlled in accordance with a scanning gate signal (SCAN) that is one type of gate signal and may be connected between the third node (N3) of the drive transistor (DRT) and the data line (DL). In other words, the scanning transistor (SCT) is turned on or turned off in accordance with a scanning gate signal (SCAN) supplied from a scanning gate line (SCL) that is one type of gate line (GL) and may control connection between the data line (DL) and the third node (N3) of the drive transistor (DRT).

The scanning transistor (SCT) is turned on in accordance with a scanning gate signal (SCAN) having a turn-on level voltage and may transfer a data voltage (Vdata) supplied from the data line (DL) to the third node (N3) of the drive transistor (DRT).

Here, in a case in which the scanning transistor (SCT) is an n-type transistor, the turn-on level voltage of the scanning gate signal (SCAN) may be a high-level voltage. In a case in which the scanning transistor (SCT) is a p-type transistor, the turn-on level voltage of the scanning gate signal (SCAN) may be a low-level voltage.

The storage capacitor (Cst) may be connected between the third node (N3) and the first node (N1) of the drive transistor (DRT). In the storage capacitor (Cst), an electric charge amount corresponding to a voltage difference between both ends is charged, and the storage capacitor (Cst) has a role for maintaining a voltage difference between both the ends for a set frame time. In accordance with this, a corresponding subpixel (SP) may emit light for the set frame time.

Referring to FIG. 3, each of multiple subpixels (SP) disposed in the display panel (PNL) of the display device according to aspects of the present disclosure may further include a sensing transistor (SENT).

The sensing transistor (SENT) is controlled in accordance with a sensing gate signal (SENSE) that is one type of gate signal and may be connected between the first node (N1) of the drive transistor (DRT) and a reference voltage line (RVL). In other words, the sensing transistor (SENT) is turned on or turned off in accordance with a sensing gate signal (SENSE) supplied from a sensing gate line (SENL) that is another type of gate line (GL) and may control connection between the reference voltage line (RVL) and the first node (N1) of the drive transistor (DRT).

The sensing transistor (SENT) is turned on in accordance with a sensing gate signal (SENSE) having a turn-on level voltage and may transfer a reference voltage (Vref) supplied from the reference voltage line (RVL) to the first node (N1) of the drive transistor (DRT).

In addition, the sensing transistor (SENT) is turned on in accordance with a sensing gate signal (SENSE) having a turn-on level voltage and may transfer a voltage of the first node (N1) of the drive transistor (DRT) to the reference voltage line (RVL).

Here, in a case in which the sensing transistor (SENT) is an n-type transistor, the turn-on level voltage of the sensing gate signal (SENSE) may be a high-level voltage. In a case in which the sensing transistor (SENT) is a p-type transistor, the turn-on level voltage of the sensing gate signal (SENSE) may be a low-level voltage.

The function of the sensing transistor (SENT) to transfer the voltage of the first node (N1) of the drive transistor (DRT) to the reference voltage line (RVL) may be used at the time of performing driving for sensing a characteristic value of the subpixel (SP). In such a case, the voltage transferred to the reference voltage line (RVL) may be a voltage used for calculating a characteristic value of the subpixel SP or a voltage in which the characteristic value of the subpixel (SP) is reflected.

Each of the drive transistor (DRT), the scanning transistor (SCT), and the sensing transistor (SENT) may be either an n-type transistor or a p-type transistor. In the present disclosure, for convenience of description, a case in which each of the drive transistor (DRT), the scanning transistor (SCT), and the sensing transistor (SENT) is the n-type will be described as an example.

The storage capacitor (Cst) may be not a parasitic capacitor (for example, Cgs or Cgd) that is an internal capacitor present between the gate node and the source node (or the drain node) of the drive transistor (DRT) but an external capacitor that is intentionally designed outside the drive transistor (DRT).

The scanning gate line (SCL) and the sensing gate line (SENL) may be mutually-different gate lines (GL). In such a case, the scanning gate signal (SCAN) and the sensing gate signal (SENSE) may be individual gate signals, and an on-off timing of the scanning transistor (SCT) and an on-off timing of the sensing transistor (SENT) disposed inside one subpixel (SP) may be independent from each other. In other words, the on-off timing of the scanning transistor (SCT) and the on-off timing of the sensing transistor (SENT) inside one subpixel (SP) may be the same or be different from each other.

Differently from this, the scanning gate line (SCL) and the sensing gate line (SENL) may be the same gate line (GL). In other words, a gate node of the scanning transistor (SCT) and a gate node of the sensing transistor (SENT) inside one subpixel (SP) may be connected to one gate line (GL). In such a case, the scanning gate signal (SCAN) and the sensing gate signal (SENSE) may be the same gate signal, and the on-off timing of the scanning transistor (SCT) and the on-off timing of the sensing transistor (SENT) inside one subpixel (SP) may be the same.

In the display region (DA) of the display panel (PNL) according to aspects of the present disclosure, transistors (DRT, SCT, SENT) may be disposed for each subpixel (SP). In a case in which the gate driving circuit (GDC) is formed as a gate in panel (GIP) type in the non-display region (NDA) of the display panel (PNL) according to aspects of the present disclosure, multiple transistors included in the gate driving circuit (GDC) of the GIP type may be disposed in the non-display region (NDA) of the display panel (PNL).

The structures of the subpixel (SP) illustrated in FIGS. 2 and 3 are examples and may be variously changed by further including one or more transistors and further includes one or more capacitors.

In FIGS. 2 and 3, although the subpixel structures have been described by assuming a case in which the display device is a self-emission display device, in a case in which the display device is a liquid crystal display device, each subpixel (SP) may include a transistor, a pixel electrode, and the like.

Figure 4:
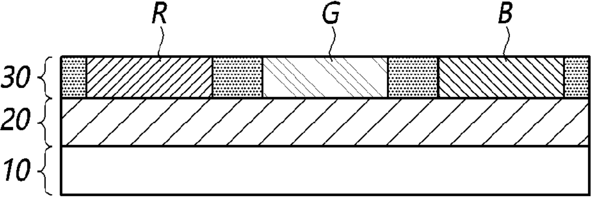
FIG. 4 is a diagram schematically illustrating a cross-sectional structure of subpixels of a display device according to aspects of the present disclosure.

FIG. 4 is a diagram schematically illustrating a cross-sectional structure of subpixels of a display device according to aspects of the present disclosure.

Referring to FIG. 4, the display device may include a light emitting element (10), a photoconversion layer (20) disposed on the light emitting element (10), and a color filter layer (30) disposed on the photoconversion layer (20).

The light emitting element (10) may be a micro light emitting element, an organic light emitting element, a quantum-dot light emitting element, or the like. For example, in a case in which the light emitting element (10) is a micro light emitting element, each subpixel may include a micro-LED that autonomously emits light and is formed on the basis of an inorganic material. In a case in which the light emitting element (10) is an organic light emitting element, each subpixel may include an organic light emitting diode that autonomously emits light. In a case in which the light emitting element (10) is a quantum-dot light emitting element, each subpixel may include a quantum-dot light emitting diode that includes a quantum dot that is a self-light emitting semiconductor crystal.

The light emitting element (10) may be a light emitting element of an individual light emission type that emits light of a color corresponding to each subpixel. In addition, the light emitting element (10) may be a light emitting element that emits blue light or white light.

However, in a case in which micro-LEDs of the individual emission type are used as light emitting elements, there is a problem in that a color shift phenomenon of a red chip according to a viewing angle occurs due to intrinsic light distribution characteristics differences of a red chip and blue and green chips of the micro-LEDs. As one way for solving this, a structure in which a photoconversion layer or a color filter layer corresponding to each subpixel is provided on a light emitting element has been introduced.

Referring to FIG. 4, a photoconversion layer (20) and a color filter layer (30) may be disposed on the light emitting element (10).

The photoconversion layer (20) uses a method in which a wavelength of light emitted by the light emitting element (10) is converted into a wavelength of light corresponding to a color corresponding to each subpixel, and light is emitted to the outside, or color purity of light that has passed through the photoconversion layer (20) is improved by additionally introducing the color filter layer (30) to the photoconversion layer (20).

The photoconversion layer (20) is a material converting a wavelength of light emitted by the light emitting element (10) and may include quantum dots of a core/shell structure.

Figure 5A:
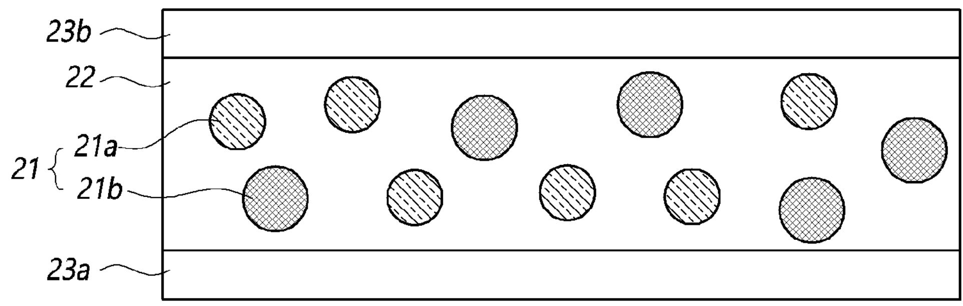
FIGS. 5A, 5B and 5C are diagrams illustrating a photoconversion layer to which a photoconversion structure body according to aspects of the present disclosure is not applied.
Figure 5B:
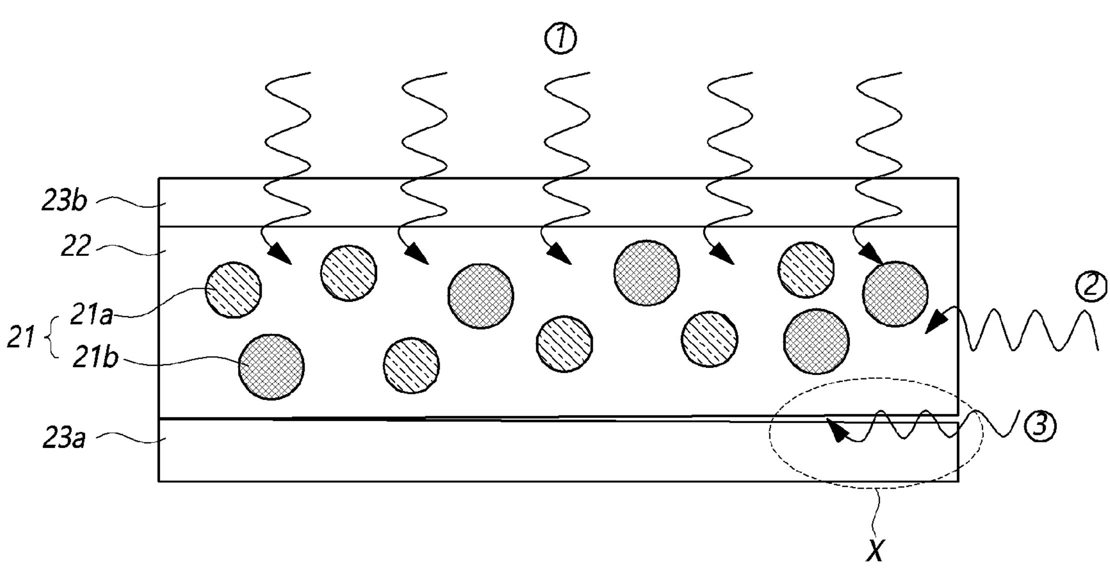
Figure 5C:
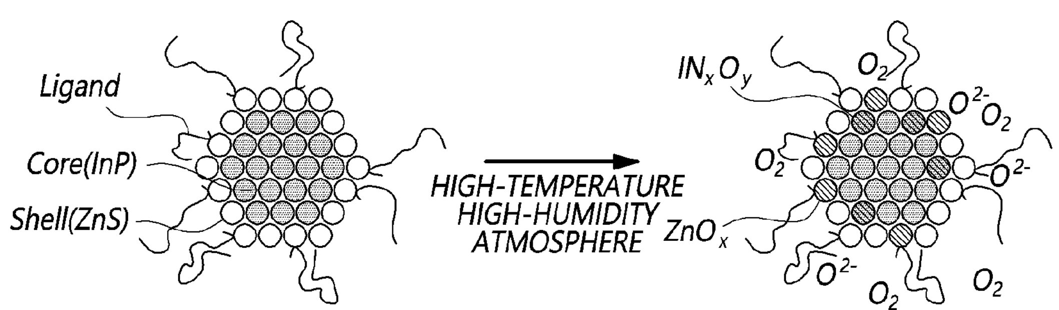

FIGS. 5A, 5B and 5C are diagrams illustrating degradation of a photoconversion layer including a photoconversion material and quantum dots of a general core/shell structure and the quantum dots.

Referring to FIGS. 5A and 5B, the photoconversion layer (20) may include quantum dot barrier layers (23*a*, 23*b*) and a resin layer (22) in which quantum dots (21) are distributed. The quantum dot barrier layers (23*a*, 23*b*) may be provided with being bonded to an upper face and a lower face of the resin layer (22).

The quantum dots (21) may include first quantum dots (21*a*) and second quantum dots (21*b*) according to wavelengths of converted light.

The quantum dot barrier layers (23*a*, 23*b*) may contain polyester, polycarbonate, polyolefin, cyclic olefin copolymer (COC), or polyimide. The quantum dot barrier layers (23*a*, 23*b*) may have a role of maintaining quantum dots (21, 21*a*, 21*b*) that are weak to moisture and oxygen by preventing penetration of moisture and oxygen into the resin layer (22).

Referring to FIG. 5B, moisture and oxygen may penetrate the photoconversion layer (20) through surfaces (area (1)) of the quantum dot barrier layers (23*a*, 23*b*), a side face (area (2)) of the resin layer (22) including quantum dots (21), and a bonding face (area (3)) between the resin layer (22) and the quantum dot barrier layers (23*a*, 23*b*).

The area (1) is influenced by physical properties of the quantum dot barrier layers (23*a*, 23*b*) and transmittance of moisture or oxygen, and moisture and oxygen that have penetrated the area (1) may cause overall degradation of the quantum dots (21).

The area (2) is influenced by transmittance of moisture or oxygen of a resin included in the resin layer (22), and moisture and oxygen that have penetrated the area (2) may cause degradation of an edge area of the photoconversion layer (20) and the quantum dots (21).

The area (3) is influenced by a bonding force between the resin layer (22) and the quantum dot barrier layers (23*a*, 23*b*), and moisture and oxygen that have penetrated the area (3) may cause degradation of the edge area of the photoconversion layer (20) and the quantum dots (21).

Although the area (1) and the area (3) may prevent penetration of moisture and oxygen in a certain part by improving physical properties of the quantum dot barrier layer or a bonding force between the resin layer and the quantum dot barrier layer, there is a problem in that the area (2) is not protected still also in accordance with physical properties of the quantum dot barrier layer, improvement of the bonding force between the resin layer and the quantum dots, and the like.

In addition, a film applied to the quantum dot barrier layer is a high-priced film, and thus an economical way for reducing a manufacturing cost of the photoconversion layer is necessary.

Referring to FIG. 5C, quantum dots included in a conventional photoconversion layer may be degraded in accordance with an irreversible reaction with moisture or oxygen.

A quantum dot (21) included in a conventional photoconversion layer (20) has a core/shell structure, and an organic ligand preventing aggregation of quantum dots on the surface is combined therein.

For example, a quantum dot may include a core/shell structure in which the core contains indium phosphate (InP), and the shell contains zinc sulfide (ZnS).

Oxygen or oxygen contained in moisture penetrates a quantum dot, reacts with indium (In) contained in the core and zinc (Zn) of ZnS contained in the shell, and forms an indium oxide (InxOy) or a zinc oxide (ZnOx), and thus photoconversion characteristics may be reduced in accordance with degradation of the quantum dot.

Figure 6A:
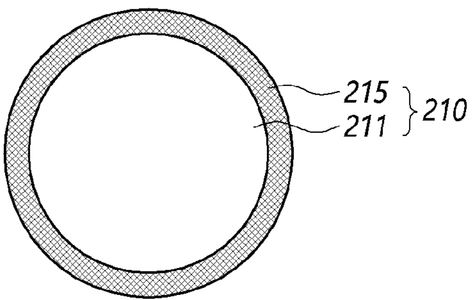
FIGS. 6A and 6B are schematic diagrams illustrating a photoconversion structure body according to aspects of the present disclosure.
Figure 6B:
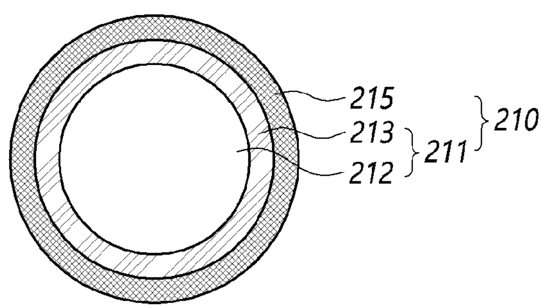

FIGS. 6A and 6B are schematic diagrams illustrating a photoconversion structure body according to aspects of the present disclosure.

Referring to FIGS. 6A and 6B, a photoconversion structure body (210) may include a quantum dot (211) and an inorganic protection layer (215).

The photoconversion structure body (210) may include a quantum dot (211) and an inorganic protection layer (215) with which the surface of the quantum dot is coated.

The photoconversion structure body (210) may have a role of emitting light released from a light emitting element that is a light source to the quantum dot (211) included in the photoconversion structure body (210), converting the light into light of a wavelength corresponding to red or green light, and extracting the converted light to the outside.

For example, the photoconversion structure body (210) may convert light of a first wavelength band released from a light source into light of a second wavelength band or convert light of the first wavelength band released from a light source into light of a third wavelength band.

The size of the quantum dot (211) may be 10 nm to 30 nm. In such a case, in a case in which the form of the quantum dot is neither a circle or a sphere, the size may represent a diameter or an equivalent diameter converted by assuming a sphere from an electron microscope image.

The quantum dot (211) may have a different size in accordance with a converted wavelength of light. For example, in a case in which a second wavelength band is larger than a third wavelength band, a first quantum dot converting light of a first wavelength band into light of the second wavelength band and a second quantum dot converting light of the first wavelength band into light of the third wavelength band may be included. In such a case, the size of the first quantum dot may be larger than the size of the second quantum dot.

The size of each of the first quantum dot and the second quantum dot may be 10 nm to 30 nm, and the first quantum dot may be larger than the second quantum dot.

Although the form of the quantum dot (211) is not particularly limited to a form that is generally used, more specifically, a form of a nano particle, a nano tube, a nano wire, a nano fiber, a nano plate-shaped particle, or the like of a sphere shape, a pyramid shape, a multi-arm shape, or a cubic shape may be used.

The quantum dot (211) may have a single structure including a core. The quantum dot (211) may have a double structure including a core (212) and a cell (213) surrounding the core (212). The cell may be composed of either one cell or multiple cells.

A thickness of the cell (213) may be equal to or smaller than ½ of the size of the core (212), and the size of the quantum dot (211) including the core (212) and the cell (213) may be 10 nm to 30 nm.

The core (212) and the cell (213) may be a semiconductor nano crystal or a metal oxide nano crystal.

For example, a semiconductor nano crystal capable of forming the core (212) and/or the cell (213) may be selected from the group composed of a periodical table II-VI group compound semiconductor nano crystal, a periodical table III-V group compound semiconductor nano crystal, a periodical table IV-VI group compound semiconductor nano crystal, and a periodical table group compound semiconductor nano crystal and combinations thereof.

More specifically, a periodical table II-VI group compound semiconductor nano crystal capable of forming the core (212) and/or the cell (213) may be selected from the group consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, and ZnS/ZnSe/CdSe and combinations thereof.

A periodical table III-V group compound semiconductor nano crystal capable of forming the core (212) and/or the cell (213) may be selected from the group consisting of AlN, AlP, AlAs, AlSb, GaN, GaP, Ga2O3, GaAs, GaSb, InN, In2O3, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, and GaInNAsSb and combinations thereof.

A periodical table IV-VI group compound semiconductor nano crystal capable of forming the core (212) and/or the cell (213) may be selected from the group consisting of TiO2, SnO2, SnS, SnS2, SnTe, PbO, PbO2, PbS, PbSe, PbTe, and PbSnTe and combinations thereof.

In addition, a periodical table group compound semiconductor nano crystal capable of forming the core (212) and/or the cell (213) may be selected from the group consisting of AgGaS2, AgGaSe2, AgGaTe2, AgInS2, CuInS2, CuInSe2, Cu2SnS3, CuGaS2, and CuGaSe2 and combinations thereof.

A surface of the quantum dot (211) may be disposed with being coated with an inorganic protection layer (215).

A thickness of the inorganic protection layer (215) may be 1 nm to 50 nm. In a case in which the thickness of the inorganic protection layer (215) is less than 1 nm, an effect of protecting the quantum dot (211) is reduced, and the quantum dot may be degraded in accordance with moisture and/or oxygen. In a case in which the thickness exceeds 50 nm, although the function for protecting the quantum dot (211) is reinforced, photoconversion efficiency according to the quantum dot (211) may be lowered.

The inorganic protection layer (215) may contain any one oxide selected from the group composed of Ga, Sn, As, Sb, Ce, Si, Al, Co, Fe, Li, Mn, Ba, Ti, Sr, V, Zn, La, Hf, Ni, and Zr or an oxide according to a combination of two or more thereof.

The inorganic protection layer (215) may be different in the thickness or a kind of oxide in accordance with the quantum dot.

For example, the thickness of each of a first inorganic protection layer with which the surface of a first quantum dot is coated and a second inorganic protection layer with which the surface of a second quantum dot is coated may be 1 nm to 50 nm. In such a case, the first inorganic protection layer and the second inorganic protection layer may have the same thickness or may have different thicknesses.

In addition, the first inorganic protection layer and the second inorganic protection layer may contain the same oxide that is one among the oxides described above or may contain mutually-different oxides.

According to aspects of the present disclosure, by introducing a photoconversion structure body including quantum dots and an inorganic protection layer with which the surface of the quantum dots is displayed to a display device, the display device of which a viewing angle and color purity are improved by solving a color shift phenomenon of a red chip and preventing degradation of the quantum dots according to moisture and oxygen while minimizing use of a barrier film may be provided.

Figure 7:
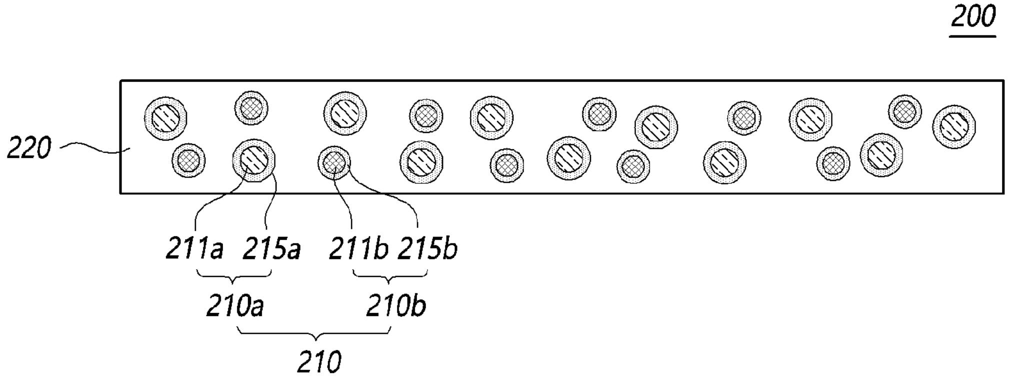
FIG. 7 is a schematic diagram illustrating a photoconversion layer according to aspects of the present disclosure.

FIG. 7 is a schematic diagram illustrating a photoconversion layer according to aspects of the present disclosure.

Description of the same constituent elements as those illustrated in FIGS. 1 to 6B among some constituent elements illustrated in FIG. 7 will be omitted.

Referring to FIG. 7, a photoconversion layer (200) may include a photoconversion structure body (210) and a resin layer (220).

The photoconversion structure body (210) may include a first photoconversion structure body (210*a*) and a second photoconversion structure body (210*b*).

The photoconversion structure body (210) may include a first photoconversion structure body (210*a*) and a second photoconversion structure body (210*b*) including quantum dots of different sizes.

The first photoconversion structure body (210*a*) may include first quantum dots (211*a*) and a first inorganic protection layer (215*a*) with which the first quantum dots (211*a*) are coated.

The second photoconversion structure body (210*b*) may include second quantum dots (211*b*) and a second inorganic protection layer (215*b*) with which the second quantum dots (211*b*) are coated.

The photoconversion structure body (210) has a role of emitting light released from a light emitting element that is a light source to the quantum dots (211) included in the photoconversion structure body (210), converting the light into light of a wavelength corresponding to red or green light, and extracting the converted light to the outside.

For example, the photoconversion structure body (210) may convert light of a first wavelength band released from a light source into light of a second wavelength band or convert light of a first wavelength band released from a light source into light of a third wavelength band.

In such a case, in a case in which the second wavelength is a wavelength corresponding to red light, and the third wavelength is a wavelength corresponding to green light, the photoconversion structure body (210) may include quantum dots of which sizes are different from each other. For example, the size of the first quantum dot (211*a*) included in the first photoconversion structure body (210*a*) converting first light into red light may be larger than the size of the second quantum dot (211*b*) included in the second photoconversion structure body (210*b*) converting the first light into green light.

In the resin layer (220), the photoconversion structure bodies (210) may be arranged to be distributed, and the resin layer (220) may be a silicon-based resin.

According to aspects of the present disclosure, by introducing a photoconversion layer including a photoconversion structure body including quantum dots and an inorganic protection layer with which the surface of the quantum dots is coated to a display device, the display device of which a viewing angle and color purity are improved by solving a color shift phenomenon of a red chip and preventing degradation of the quantum dots according to moisture and oxygen while minimizing use of a barrier film may be provided.

Figure 8:
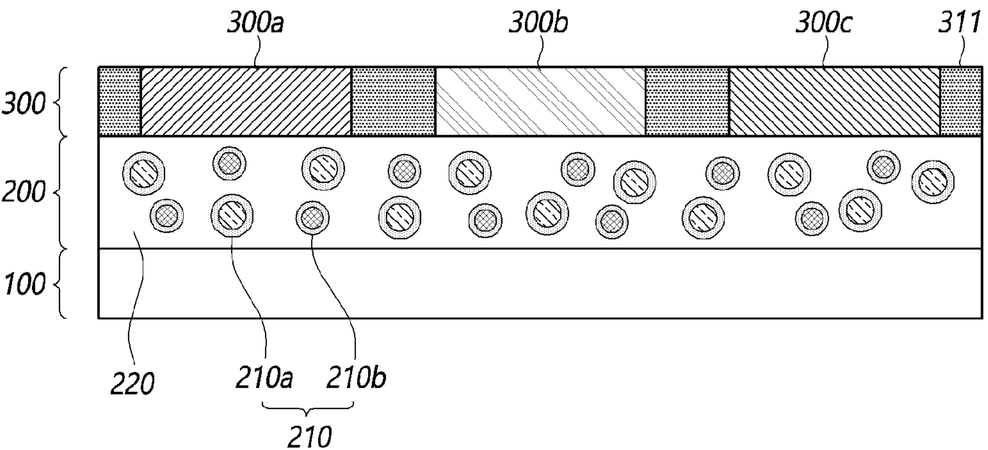
FIG. 8 is a diagram illustrating a cross-sectional structure of subpixels of a display device according to aspects of the present disclosure.

FIG. 8 is a diagram illustrating a cross-sectional structure of subpixels of a display device according to aspects of the present disclosure.

Description of the same constituent elements as those illustrated in FIGS. 1 to 7 among some constituent elements illustrated in FIG. 8 will be omitted.

Referring to FIG. 8, the display device according to aspects of the present disclosure includes a plurality of subpixels and may include a light emitting element (100), a photoconversion layer (200), and a color filter layer (300).

The light emitting element (100) may include a lighting emitting diode disposed on the substrate. The light emitting diode may be an organic light emitting diode, an inorganic light emitting diode, a quantum dot light emitting diode, a micro light emitting diode, a mini light emitting diode, or the like but is not limited thereto. Specific constituent elements of the light emitting element (100) will be described below.

The photoconversion layer (200) may be disposed on the light emitting element (100).

A planarization layer (not illustrated) may be disposed between the light emitting element (100) and the photoconversion layer (200).

The photoconversion layer (200) may include a photoconversion structure body (210) and a resin layer (220).

The photoconversion structure body (210) may include quantum dots (211) and an inorganic protection layer (215) with which the quantum dots are coated.

The photoconversion structure body (210) may include a first photoconversion structure body (210*a*) that converts light of a first wavelength band released from a light source into light of a second wavelength band and a second photoconversion structure body (210*b*) that converts light of a first wavelength band released from a light source into light of a third wavelength band. In such a case, the size of the first quantum dot (211*a*) included in the first photoconversion structure body (210*a*) and the size of the second quantum dot (211*b*) included in the second photoconversion structure body (210*b*) may be different from each other.

The photoconversion structure body (210) has a role of emitting light released from a light emitting element that is a light source to the quantum dots (211) included in the photoconversion structure body (210), converting the light into light of a wavelength corresponding to red or green light, and extracting the converted light to the outside.

For example, the light of the first wavelength band may be blue light, the light of the second wavelength band may be red light, and the light of the third wavelength band may be green light. In such a case, the size of the first quantum dot (211*a*) included in the first photoconversion structure body (210*a*) converting blue light into red light may be larger than the size of the second quantum dot (211*b*) included in the second photoconversion structure body (210*b*) converting blue light into green light.

Referring to FIG. 8, the color filter layer (300) may be disposed on the photoconversion layer (200).

The color filter layer (300) may include color filter layers of colors corresponding to a plurality of subpixel regions.

For example, the color filter layer (300) may include a first color filter layer (300*a*) of red (R), a second color filter layer (300*b*) of green (G), and a third color filter layer (300*c*) of blue (B).

The color filter layers (300) may be partitioned by first black matrixes (311) in the plurality of subpixel regions. The first black matrixes (311) may prevent light that has passed through the photoconversion layer (200) and the color filter layer (300) from being mixed in color.

For example, in a case in which the light emitting element (100) emits blue light of the first wavelength band, in the photoconversion layer (200), the first photoconversion structure body (210*a*) converts a part of the blue light into red light that is light of the second wavelength band, and the second photoconversion structure body converts a part of the blue light into green light that is light of the third wavelength band.

In a first subpixel, red light converted in the photoconversion layer (200) passes through the first color filter layer (300*a*) of red (R), and the red light may be extracted to the outside. In a second subpixel, green light converted in the photoconversion layer (200) passes through the second color filter layer (300*b*) of green (G), and the green light may be extracted to the outside. In a third subpixel, blue light converted in the photoconversion layer (200) passes through the third color filter layer (300*c*) of blue (B), and the blue light may be extracted to the outside.

On the other hand, in a case in which the light emitting element (100) emits white light including blue light of the first wavelength band, in the first subpixel, red light converted in the photoconversion layer (200) passes through the first color filter layer (300*a*) of red (R), and the red light may be extracted to the outside. In the second subpixel, green light converted in the photoconversion layer (200) passes through the second color filter layer (300*b*) of green (G), and the green light may be extracted to the outside. In the third subpixel, blue light and a part of white light that have not been converted in the photoconversion layer (200) pass through the third color filter layer (300*c*) of blue (B), and the blue light may be extracted to the outside.

Figure 9:
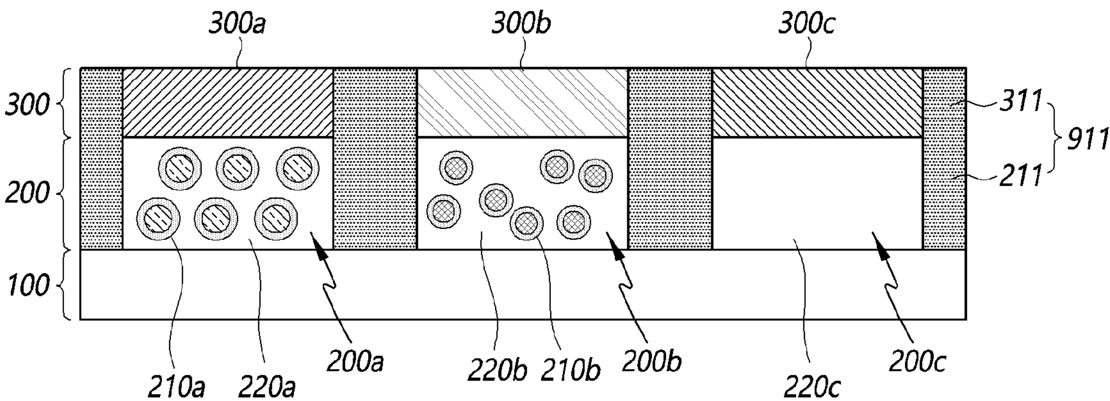
FIG. 9 is a diagram illustrating a cross-sectional structure of subpixels of a display device according to other aspects of the present disclosure.

FIG. 9 is a diagram illustrating a cross-sectional structure of subpixels of a display device according to other aspects of the present disclosure.

Description of the same constituent elements as those illustrated in FIGS. 1 to 8 among some constituent elements illustrated in FIG. 9 will be omitted.

Referring to FIG. 9, the display device according to aspects of the present disclosure includes a plurality of subpixels and may include a light emitting element (100), a photoconversion layer (200), and a color filter layer (300).

The light emitting element (100) may include a lighting emitting diode disposed on the substrate. Specific constituent elements of the light emitting element (100) will be described below.

The photoconversion layer (200) may be disposed on the light emitting element (100).

A planarization layer (not illustrated) may be disposed between the light emitting element (100) and the photoconversion layer (200).

The photoconversion layer (200) may include photoconversion layers (200) corresponding to a plurality of subpixel regions. The photoconversion layer (200) may include a photoconversion structure body and a resin layer. The photoconversion layer (200) may include a first photoconversion layer (200*a*) including a first photoconversion structure body (210*a*) and a first resin layer (220*a*), a second photoconversion layer (200*b*) including a second photoconversion structure body (210*b*) and a second resin layer (220*b*), and a light transmissive layer (200*c*) including a third resin layer (220*c*) including no photoconversion structure body.

The light transmissive layer (200*c*) may be formed as the third resin layer (220*c*) including no photoconversion structure body. The first to third resin layers (220*a*, 220*b*, 220*c*) may be a transparent silicon-based resin.

The photoconversion structure body (210) may include quantum dots (211) and an inorganic protection layer (215) with which the quantum dots are coated.

The first photoconversion structure body (210*a*) may convert light of a first wavelength band released from a light source into light of a second wavelength band, and the second photoconversion structure body (210*b*) may convert light of a first wavelength band released from a light source into light of a third wavelength band. In such a case, the size of the first quantum dot (211*a*) included in the first photoconversion structure body (210*a*) and the size of the second quantum dot (211*b*) included in the second photoconversion structure body (210*b*) may be different from each other.

In the plurality of subpixels, a first subpixel region may include the first light transmissive layer (200*a*), a second subpixel region may include the second photoconversion layer (200*b*), and a third subpixel region may include the light transmissive layer (200*c*).

The first photoconversion structure body (210*a*) may convert light of a first wavelength band released from a light source into light of a second wavelength band, and the second photoconversion structure body (210*b*) may convert light of a first wavelength band released from a light source into light of a third wavelength band. The light transmissive layer (200*c*) may transmit light of the first wavelength band released from a light source as it is.

For example, the light of the first wavelength band may be blue light, the light of the second wavelength band may be red light, and the light of the third wavelength band may be green light. In such a case, the size of the first quantum dot (211*a*) included in the first photoconversion structure body (210*a*) converting blue light into red light may be larger than the size of the second quantum dot (211*b*) included in the second photoconversion structure body (210*b*) converting blue light into green light.

Referring to FIG. 9, the color filter layer (300) may be disposed on the photoconversion layer (200).

The color filter layer (300) may include color filter layers of colors corresponding to a plurality of subpixel regions.

For example, the color filter layer (300) may include a first color filter layer (300*a*) of red (R), a second color filter layer (300*b*) of green (G), and a third color filter layer (300*c*) of blue (B).

Referring to FIG. 9, in the plurality of subpixel regions, the photoconversion layers (200) and the color filter layers (300) may be partitioned by black matrixes (911). The photoconversion layers (200) may be partitioned by second black matrixes (211), and the color filter layers (300) may be partitioned by first black matrixes (311). In addition, the first black matrixes (311) and the second black matrixes (211) may be integrally formed in the same process or may be formed in separate processes.

For example, after black matrixes (911) that simultaneously partition photoconversion layers (200) and color filter layers (300) corresponding to the plurality of subpixel regions are formed on the light emitting element (100), the photoconversion layers (200) and the color filter layers (300) may be formed. Alternatively, after second black matrixes (211) partitioning photoconversion layers (200) corresponding to the plurality of subpixel regions are formed on the light emitting element (100), the photoconversion layers (200) may be formed. Then, after the first black matrixes (311) are formed on the photoconversion layers (200), color filter layers (300) may be formed.

The black matrixes (911) may prevent light that has passed through the photoconversion layer (200) and the color filter layer (300) from being mixed in color.

For example, in a case in which the light emitting element (100) emits blue light of the first wavelength band, in the first photoconversion layer (200*a*), the first photoconversion structure body (210*a*) converts a part of the blue light into red light that is light of the second wavelength band, and, in the second photoconversion layer (200*b*), the second photoconversion structure body converts a part of the blue light into green light that is light of the third wavelength band.

In a first subpixel, red light converted in the first photoconversion layer (200*a*) passes through the first color filter layer (300*a*) of red (R), and the red light may be extracted to the outside. In a second subpixel, green light converted in the second photoconversion layer (200*b*) passes through the second color filter layer (300*b*) of green (G), and the green light may be extracted to the outside. In a third subpixel, blue light that has passed through the light transmissive layer (200*c*) passes through the third color filter layer (300*c*) of blue (B), and the blue light may be extracted to the outside.

On the other hand, in a case in which the light emitting element (100) emits white light including blue light of the first wavelength band, in the first subpixel, red light converted in the first photoconversion layer (200*a*) passes through the first color filter layer (300*a*) of red (R), and the red light may be extracted to the outside. In the second subpixel, green light converted in the second photoconversion layer (200*b*) passes through the second color filter layer (300*b*) of green (G), and the green light may be extracted to the outside. In the third subpixel, blue light and a part of white light that have passed through the light transmissive layer (200*c*) pass through the third color filter layer (300*c*) of blue (B), and the blue light may be extracted to the outside.

Figure 10:
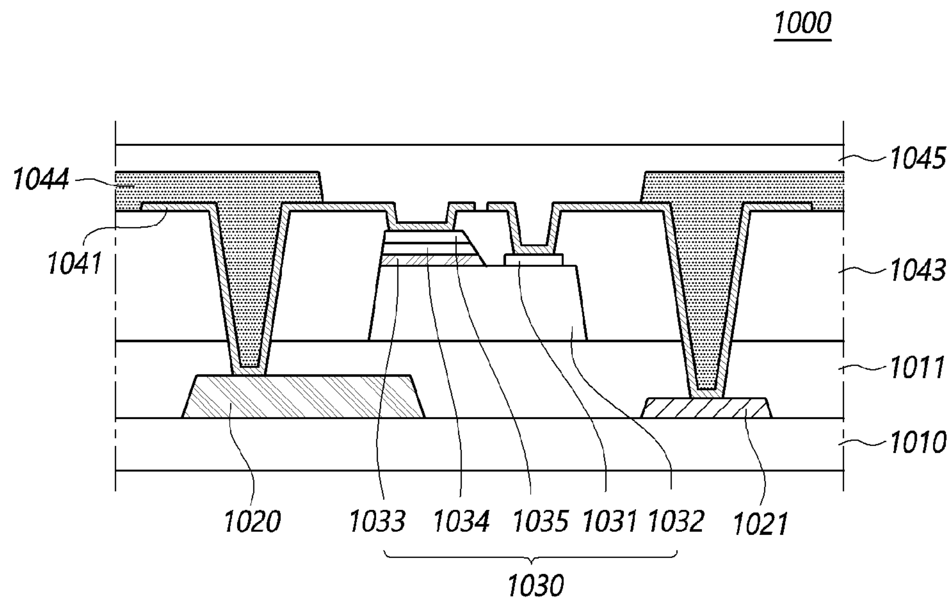
FIG. 10 is a diagram schematically illustrating a cross-sectional structure of a micro-light emitting element that is a light emitting element of a display device according to other aspects of the present disclosure.

FIG. 10 is a diagram schematically illustrating a cross-sectional structure of a micro-light emitting element (1000) that is a light emitting element of a display device according to other aspects of the present disclosure.

Description of the same constituent elements as those illustrated in FIGS. 1 to 9 among some constituent elements illustrated in FIG. 10 will be omitted.

Referring to FIG. 10, a thin film transistor (1020) may be disposed on a substrate (1010).

The substrate (1010) may be composed of a transparent material such as glass or plastic and may have a plurality of subpixel regions.

The thin film transistor (1020) controls each light emitting diode (LED, 1030) and may emit light in accordance with a drive signal input from the outside through a wiring applied to the LED (130) to realize an image when turned on.

A common wiring (1021) may be disposed in the same layer as that of the thin film transistor (1020).

The common wiring (1021) may transfer a first power supply voltage that is used in common to the LED (1030). For example, the common wiring (1021) may transfer the first power supply voltage to an n-type electrode of a light emitting diode to be described below.

On the thin film transistor (1020) and the common wiring (1021), a first planarization layer (1011) used for protecting and planarizing the thin film transistor (1020) and the common wiring (1021) is disposed.

The first planarization layer (1011) may be composed of a single layer or multiple layers of photo acryl, light-transmissive epoxy, a silicon oxide (SiOx), or silicon nitride (SiNx) but is not limited thereto.

In the first planarization layer (1011), a first contact hole exposing a part of a source electrode of the thin film transistor (1020) and a part of the common wiring (1021) may be formed. The source electrode of the thin film transistor (1020) may be connected to a p-type electrode (1035) of the LED through a first connection wiring (1041). The common wiring (1021) may be connected to an n-type electrode (1031) of an LED through a second connection wiring (1042). The first connection wiring (1041) and the source electrode of the thin film transistor (1020) and the second connection wiring (1042) and the common wiring (1021) may be directly connected or may be electrically connected through connection parts.

On the first planarization layer (1011), an LED (1030) may be disposed.

The LED (1030) may include an n-type electrode (1031), an n-type layer (1032), an active layer (1033), a p-type layer (1034), and a p-type electrode (1035). For example, the LED (1030) has a structure in which the n-type electrode (1031) and the active layer (1033) are positioned on the n-type layer (1032), and the p-type layer (1034) and the p-type electrode (1035) are sequentially positioned on the active layer (1033), and a structure of the LED of a lateral form may be employed. Hereinafter, although the structure of the LED (1030) will be described as being the lateral form, the structure of the LED (1030) is not limited thereto, and the structure may have a vertical or flip form. The LED (1030) may be either a micro-LED (the chip size is equal to or less than 100 μm) or a mini-LED (a chip size is several hundreds of μm).

The p-type electrode (1035) positioned on the uppermost layer among the constituent elements of the LED (1030) is connected to the thin film transistor (1020) and is applied with a second power supply voltage, and the second power supply voltage may provide a positive load to the p-type electrode (1035).

The p-type layer (1034) positioned under the p-type electrode (1035) receives supply of holes from the p-type electrode (1035), is a semiconductor layer in which a current is generated in accordance with holes having positive electric charge moving as carriers, and may be formed using a p-GaN-based material. The p-GaN-based material may be GaN, AlGaN, InGaN, AlInGaN, or the like, and Mg, Zn, Be, or the like may be used as an impurity used for doping the p-type semiconductor.

The active layer (1033) may be disposed under the p-type layer (1034). The active layer (1033) is disposed on the n-type layer (1032) and may have a multi quantum well (MQW) structure having a well layer and a barrier layer having a higher band gap than the well layer. For example, the active layer (1033) may have the multi quantum well structure of AlGaInP, GaInP, InGaN, GaN, and the like.

The n-type layer (1032) positioned under the active layer (1033) receives supply of electrons from the n-type electrode (1031), is a semiconductor layer in which a current is generated in accordance with free electrons having negative electric charge moving as carriers, and may be formed using an n-GaN-based material. The n-GaN-based material may be GaN, AlGaN, InGaN, AlInGaN, or the like, and Si, Ge, Se, Te, C, or the like may be used as an impurity used for doping the n-type layer (1032). The n-type layer (1032) may protrude to the outer side of the active layer (1033). In other words, the active layer (1033) and the p-type layer (1034) may have areas smaller than the n-type layer (1032) such that an upper face of the n-type layer (1032) is exposed.

The n-type electrode (1031) may be disposed in a part of the n-type layer (1032) that protrudes to the outer side of the active layer (1033). The n-type electrode (1031) is connected to the common wiring (1021) and may be applied with the first power supply voltage. The common wiring (1021) is connected to be common to each LED (1030) and may apply a constant voltage. The common wiring (1021) may supply a negative load to the n-type electrode (1031).

A second planarization layer (1043) may be disposed to surround an upper part and a side part of the LED (1030). For electric connection of the LED (1030), in an upper part of the second planarization layer (1043), a plurality of second contact holes exposing the p-type electrode (1035) and the n-type electrode (1031) of the LED (1030) may be formed.

Similar to the first planarization layer (1011), the second planarization layer (1043) may be composed of a single or multiple layers of photo acryl, light-transmissive epoxy, a silicon oxide (SiOx), or silicon nitride (SiNx).

Then, by forming a third contact hole in an area of the second planarization layer (1043) at which the first contact hole is positioned, a part of the source electrode of the thin film transistor (1020) and a part of the common wiring (1021) are exposed.

The first connection wiring (1041) may be disposed for electric connection between the source electrode of the thin film transistor (1020) that is exposed through the third contact hole and the p-type electrode (1035) of the LED, and the second connection wiring (1042) may be disposed for electric connection between the common wiring (1021) exposed through the third contact hole and the n-type electrode (1031) of the LED.

A third black matrix (1044) may be disposed on the first connection wiring (1041), the second connection wiring (1042), and a part of the second planarization layer (1043). The third black matrix (1044) may be disposed on boundaries between LEDs (1030) that are subpixels. The third black matrix (1044) may shield light out of light emitted from each LED (1030) toward another LED (1030) and reduce color mixture of light. The third black matrix (1044) coats the upper side of the whole substrate using a photoresist material into which a carbon black material is mixed and may be formed using a photolithography process.

On the third black matrix (1044), the second planarization layer (1043), the first connection wiring (1041), and the second connection wiring (1042), the third planarization layer (1045) is disposed and may be formed to cover the entire upper part of the substrate (1010).

The third planarization layer (1045) is a layer that is used for protecting the LED (1030) on the substrate (1010) and enabling easy attachment to the photoconversion layer (200) disposed on the light emitting element. Similar to the first planarization layer (1011), the third planarization layer (1045) may be composed of a single or multiple layers of photo acryl, light-transmissive epoxy, a silicon oxide (SiOx), or silicon nitride (SiNx).

Figure 11:
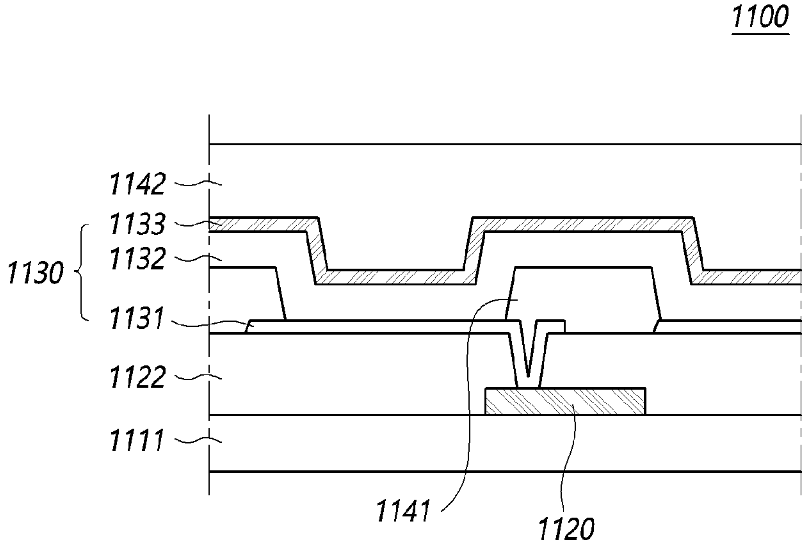
FIG. 11 is a diagram schematically illustrating a cross-sectional structure of an organic light emitting element that is a light emitting element of a display device according to aspects of the present disclosure.

FIG. 11 is a diagram schematically illustrating a cross-sectional structure of an organic light emitting element (1100) that is a light emitting element of a display device according to aspects of the present disclosure.

Description of the same constituent elements as those illustrated in FIGS. 1 to 10 among some constituent elements illustrated in FIG. 11 will be omitted.

Referring to FIG. 11, a thin film transistor (1120) may be disposed on a substrate (1111).

The substrate (1111) may be composed of a transparent material such as glass or plastic and may have a plurality of subpixel regions.

The thin film transistor (1120) controls each organic light emitting diode (OLED, 1130) and may emit light in accordance with a drive signal input from the outside through a wiring applied to the OLED (1130) to realize an image when turned on.

On the thin film transistor (1120), a first planarization layer (1122) used for protecting and planarizing the thin film transistor (1120) is disposed.

The first planarization layer (1122) may be composed of a single or multiple layers of photo acryl, light-transmissive epoxy, a silicon oxide (SiOx), or silicon nitride (SiNx) but is not limited thereto.

In the first planarization layer (1022), a contact hole exposing a part of a source electrode of the thin film transistor (1120) may be formed. The source electrode of the thin film transistor (1120) may be connected to a first electrode (1131) of the OLED.

An OLED (1130) and a bank layer (1141) may be disposed on the first planarization layer (1011).

The OLED (1130) may include a first electrode (1131), a light emitting material layer, and a second electrode (1133). The first electrode (1131) may be an anode electrode, and the second electrode (1133) may be a cathode electrode.

The light emitting material layer may be an organic light emitting layer (1132) including an organic light emitting material.

The first electrode (1131) may be disposed on the first planarization layer (1122). The first electrode (1131) may be connected to a source electrode of the thin film transistor (1120) through a contact hole passing through the first planarization layer (1122).

The bank layer (1141) may be formed to cover an edge of the first electrode (1131) on the first planarization layer (1122) for partitioning subpixel regions. An area in which the bank layer (1141) is formed does not emit light and thus may be defined as a non-light emitting part, and an area in which the bank layer (1141) is not formed may be defined as a light emitting part.

The bank layer (1141) may be formed using an organic material such as an acryl resin, an epoxy resin, a phenolic resin, a polyamide resin, or a polyimide resin but is not limited thereto.

An organic light emitting layer (1132) may be formed on the first electrode (1131) and the bank layer (1141). The organic light emitting layer (1132) may be formed to be common to subpixel regions.

The organic light emitting layer (1132) may include a hole injection layer, a hole transporting layer, at least one light emitting layer, an electron transporting layer, and an electron injection layer.

The OLED (1130) may be formed as a top emission type emitting light in an upward direction.

In such a case, the first electrode (1131) may be a reflection electrode. For example, the first electrode (1131) may be formed using a metal material having high reflectivity such as a lamination structure of aluminum and titanium (Ti/Al/Ti), a lamination structure of aluminum and an indium tin oxide (ITO), an APC alloy, or a lamination structure of an APC alloy and an ITO (ITO/APC/ITO). The APC alloy is an alloy of silver (Ag), palladium (Pd), and copper (Cu).

The second electrode (1133) may be formed to be common to subpixel regions. The second electrode (1133) may be a transmissive electrode. For example, the second electrode (1133) may be formed using a transparent conductive material such as indium tin oxide (ITO), antimony tin oxide (ATO), and indium zinc oxide (IZO).

On the second electrode (1133), an encapsulation layer (not illustrated) may be disposed for preventing penetration of oxygen or moisture from the outside to the OLED (1130). The encapsulation layer may be formed as another layer in which an inorganic layer and an organic layer are alternately stacked but is not limited thereto.

On the encapsulation layer, the second planarization layer (1142) is disposed and may be formed to cover the whole upper part of the substrate (1111).

The second planarization layer (1142) is a layer used for protecting the OLED (1130) on the substrate (1111) and enabling easy attachment to the photoconversion layer (200) disposed on the light emitting element. Similar to the first planarization layer (1122), the second planarization layer (1142) may be composed of a single layer or multiple layers of photo acryl, light-transmissive epoxy, a silicon oxide (SiOx), or silicon nitride (SiNx)

Although the light emitting element disclosed in FIG. 11 has been described such that the light emitting material layer is the organic light emitting layer (1132) as an example, the light emitting material layer may be an inorganic light emitting layer containing an inorganic light emitting material.

For example, the light emitting element may be an inorganic light emitting element including an inorganic light emitting layer in which a light emitting material layer includes a first electric charge moving layer, at least one light emitting layer, and a second electric charge moving layer, a quantum dot light emitting element, or the like.

Figure 12:
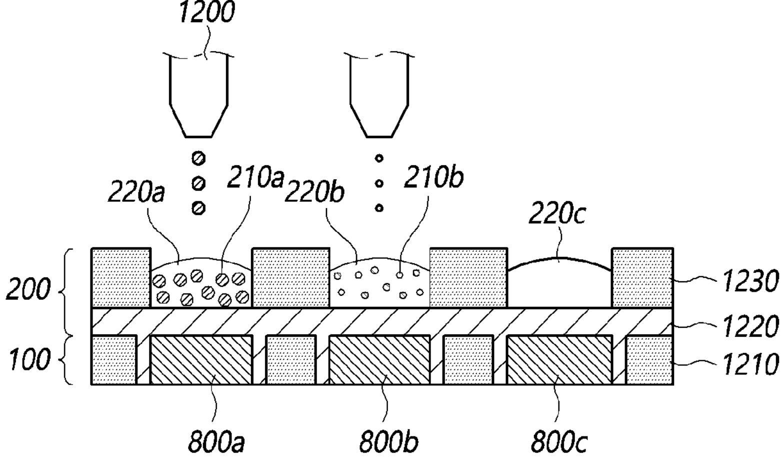
FIG. 12 is a diagram schematically illustrating a method for manufacturing a photoconversion layer according to aspects of the present disclosure.

FIG. 12 is a diagram schematically illustrating a method for manufacturing a photoconversion layer according to aspects of the present disclosure.

Description of the same constituent elements as those illustrated in FIGS. 1 to 11 among some constituent elements illustrated in FIG. 12 will be omitted.

Referring to FIG. 12, a light emitting element (100) may include a first light emitting element (800*a*), a second light emitting element (800*b*), and a third light emitting element (800*c*) in each of a plurality of subpixel regions.

The light emitting elements (800*a*, 800*b*, 800*c*) may be partitioned using a fourth black matrix (1210).

A planarization layer (1220) may be disposed on the light emitting element (100).

A fifth black matrix (1230) partitioning a plurality of subpixel regions may be disposed on the planarization layer (1220).

A photoconversion layer may be formed using an inkjet method.

For example, a first photoconversion layer (200*a*) may be formed by spraying a solution containing a first photoconversion structure body (210*a*) and a first resin layer (220*a*) to a first subpixel region partitioned using the fifth black matrix (1230) through a nozzle (1200), and a second photoconversion layer (200*b*) may be formed by spraying a solution containing a second photoconversion structure body (210*b*) and a second resin layer (220*b*) to a second subpixel region through the nozzle (1200). The third subpixel region may be formed using a solution containing the third resin layer (220*c*).

According to aspects of the present disclosure, a display device of which a viewing angle and color purity are improved by solving a color shift phenomenon of a red chip and preventing degradation of the quantum dots according to moisture and oxygen while minimizing use of a barrier film may be provided.

According to aspects of the present disclosure, by including a photoconversion structure body including quantum dots and an inorganic protection layer coating the surface of the quantum dots in the photoconversion layer, a display device that solves a color shift phenomenon according to a red chip may be provided.

According to aspects of the present disclosure, a display device preventing degradation of the quantum dots according to moisture and oxygen may be provided by including a photoconversion structure body including quantum dots and an inorganic protection layer coating the surface of the quantum dots in the photoconversion layer.

According to aspects of the present disclosure, by including a photoconversion structure body including quantum dots and an inorganic protection layer coating the surface of the quantum dots in the photoconversion layer, a display device capable of reducing a manufacturing cost by minimizing use of a barrier film in the photoconversion layer may be provided.

The aspects of the present disclosure described above may be simplified as below.

A display device according to aspects of the present disclosure may include: a substrate (100); a light emitting element disposed on the substrate; and a photoconversion layer (200) disposed on the light emitting element and including a photoconversion structure body (210).

The photoconversion structure body (210) may include: a quantum dot (211); and an inorganic protection layer (215) coating a surface of the quantum dot.

A size of the quantum dot (211) may be 10 nm to 30 nm.

A thickness of the inorganic protection layer (215) may be 1 nm to 50 nm.

The quantum dot (211) may include a core (212) including any one selected from the group consisting of II-VI group compounds, III-V group compounds, IV-VI group compounds, and group compounds and combinations of the compounds.

The quantum dot (211) may further include a cell (213) surrounding the core (212), and the cell includes any one selected from the group consisting of II-VI group compounds, III-V group compounds, IV-VI group compounds, and group compounds and combinations of the compounds.

A thickness of the cell (213) may be equal to or smaller than ½ of a size of the core (212), and a size of the quantum dot (211) including the core and the cell may be 10 nm to 30 nm.

The inorganic protection layer (215) may include at least one oxide selected from the group consisting of Ga, Sn, As, Sb, Ce, Si, Al, Co, Fe, Li, Mn, Ba, Ti, Sr, V, Zn, La, Hf, Ni, and Zr.

A display device according to aspects of the present disclosure is a display device in which the photoconversion structure body (210) includes a first photoconversion structure body (210*a*) and a second photoconversion structure body (210*b*) including quantum dots of mutually-different sizes.

In the display device according to aspects of the present disclosure, the photoconversion structure body (210) may be distributed in a silicon-bases resin in the photoconversion layer (200).

The display device according to aspects of the present disclosure may further include a color filter layer (300) on the photoconversion layer (200).

In the display device according to aspects of the present disclosure, the light emitting element (100) emits blue light.

A display device according to aspects of the present disclosure may include: a substrate including a plurality of subpixel regions; a light emitting element (100) disposed on the substrate and emitting light of a first wavelength band; and a photoconversion layer (200) disposed on the light emitting element.

The photoconversion layer (200) may include: a first photoconversion layer (200*a*) including a first photoconversion structure body (210*a*) converting light of the first wavelength band into light of a second wavelength band in a first subpixel region; and a second photoconversion layer (200*b*) including a second photoconversion structure body (210*b*) converting light of the first wavelength band into light of a third wavelength band in a second subpixel region.

The first photoconversion structure body (210*a*) may include a first quantum dot (211*a*) and a first inorganic protection layer (215*a*) coating a surface of the first quantum dot, and the second photoconversion structure body (210*b*) may include a second quantum dot (211*b*) of which a size is different from that of the first quantum dot and a second inorganic protection layer (215*b*) coating a surface of the second quantum dot.

The size of each of the first quantum dot (211*a*) and the second quantum dot (211*b*) may be 10 nm to 30 nm A thickness of each of the first inorganic protection layer (215*a*) and the second inorganic protection layer (215*b*) may be 1 nm to 50 nm.

Each of the first inorganic protection layer (215*a*) and the second inorganic protection layer (215*b*) may include one oxide selected from the group consisting of Ga, Sn, As, Sb, Ce, Si, Al, Co, Fe, Li, Mn, Ba, Ti, Sr, V, Zn, La, Hf, Ni, and Zr.

In the display device according to aspects of the present disclosure, a first color filter layer (300*a*) corresponding to the light of the second wavelength band may be disposed in the first subpixel region, and a second color filter layer (300*b*) corresponding to the light of the third wavelength band may be disposed in the second subpixel region.

In the display device according to aspects of the present disclosure, the plurality of subpixel regions may include a third subpixel region, and the photoconversion layer (200) may include a light transmissive layer (200*c*) in which no photoconversion structure body (210) is disposed in the third subpixel region.

A third color filter layer (300*c*) corresponding to the light of the first wavelength band may be disposed in the third subpixel region.

In the display device according to aspects of the present disclosure, the plurality of subpixel regions may be defined using a black matrix.

In the display device according to aspects of the present disclosure, a planarization layer may be disposed between the light emitting element (100) and the photoconversion layer (200).

In the display device according to aspects of the present disclosure, light of the first wavelength band may be blue light, light of the second wavelength band may be red light, and light of the third wavelength band may be green light.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:

a substrate;

a light emitting element disposed on the substrate;

a photoconversion layer disposed on the light emitting element, including a photoconversion structure body and first and second photoconversion layers separated from each other;

a color filter layer disposed on the photoconversion layer, and including first and second color filter layers corresponding to the first and second photoconversion layers, respectively; and a black matrix defining the first and second color filter layers and the first and second photoconversion layers, wherein:

he photoconversion structure body includes a quantum dot and an inorganic protection layer surrounding a surface of the quantum dot; and the photoconversion structure body is distributed in a silicon-based resin in the photoconversion layer.

2. The display device according to claim 1, wherein a size of the quantum dot is in a range of 10 nm to 30 nm, and wherein a thickness of the inorganic protection layer is in a range of 1 nm to 50 nm.

3. The display device according to claim 1, wherein the quantum dot includes a core including one selected from the group consisting of II-VI group compounds, III-V group compounds, IV-VI group compounds, or I-III-VI group compounds, and the group consisting of combinations of the II-VI group compounds, III-V group compounds, IV-VI group compounds, and I-III-VI group compounds.

4. The display device according to claim 3, wherein the quantum dot further includes a cell surrounding the core, and wherein the cell includes one selected from the group consisting of II-VI group compounds, III-V group compounds, IV-VI group compounds, and I-III-VI group compounds and combinations of the compounds.

5. The display device according to claim 4, wherein a thickness of the cell is equal to or smaller than ½ of a size of the core, and wherein a size of the quantum dot including the core and the cell is in a range of 10 nm to 30 nm.

6. The display device according to claim 1, wherein the inorganic protection layer includes one oxide selected from the group consisting of Ga, Sn, As, Sb, Ce, Si, Al, Co, Fe, Li, Mn, Ba, Ti, Sr, V, Zn, La, Hf, Ni, and Zr.

7. The display device according to claim 1, wherein the photoconversion structure body includes a first photoconversion structure body and a second photoconversion structure body including quantum dots having a size different from the first photoconversion structure body.

8. The display device according to claim 1, wherein an outer edge of the color filter layer is aligned with an outer edge of the photoconversion layer in a plan view.

9. The display device according to claim 1, wherein the light emitting element emits blue light.

10. The display device according to claim 1, wherein the black matrix extends continually between respective adjacent lower edges of the first and second color filter layers and between respective adjacent upper edges of the first and second photoconversion layers.

11. The display device according to claim 1, further comprising a planarization layer disposed between the substrate and the light emitting element, wherein the black matrix is disposed in a respective area between adjacent light emitting elements, and a portion of the black matrix is located in a contact hole of the planarization layer.

12. A display device comprising:

a substrate including a plurality of subpixel regions;

a light emitting element disposed on the substrate and emitting light of a first wavelength band; and a photoconversion layer disposed on the light emitting element and including first and second photoconversion layers separated from, and adjacent to, each other, wherein:

the first photoconversion layer includes a first photoconversion structure body converting light of the first wavelength band into light of a second wavelength band in a first subpixel region;

the second photoconversion layer includes a second photoconversion structure body converting light of the first wavelength band into light of a third wavelength band in a second subpixel region;

both the converting light of the first wavelength band into the light of the second wavelength band by the first photoconversion layer and the converting light of the first wavelength band into the light of the third wavelength band by the second photoconversion layer are performed based on the first wavelength band of the same light emitting element;

the first photoconversion structure body includes a first quantum dot and a first inorganic protection layer surrounding a surface of the first quantum dot; and the second photoconversion structure body includes a second quantum dot of which a size is different from that of the first quantum dot and a second inorganic protection layer surrounding a surface of the second quantum dot; and the first and second photoconversion structure bodies are distributed in a silicon-based resin in the photoconversion layer.

13. The display device according to claim 12, wherein the size of each of the first quantum dot and the second quantum dot is in a range of 10 nm to 30 nm, and wherein a thickness of each of the first inorganic protection layer and the second inorganic protection layer is in a range of 1 nm to 50 nm.

14. The display device according to claim 13, wherein each of the first inorganic protection layer and the second inorganic protection layer includes one oxide selected from the group consisting of Ga, Sn, As, Sb, Ce, Si, Al, Co, Fe, Li, Mn, Ba, Ti, Sr, V, Zn, La, Hf, Ni, and Zr.

15. The display device according to claim 12, further comprising:

a first color filter layer corresponding to the light of the second wavelength band and disposed in the first subpixel region; and a second color filter layer corresponding to the light of the third wavelength band and disposed in the second subpixel region.

16. The display device according to claim 12, further comprising a third subpixel region in the plurality of subpixel regions, wherein the photoconversion layer includes a light transmissive layer in which no photoconversion structure body is disposed in the third subpixel region.

17. The display device according to claim 16, further comprising a third color filter layer corresponding to the light of the first wavelength band is disposed in the third subpixel region.

18. The display device according to claim 12, wherein the plurality of subpixel regions are defined by a black matrix.

19. The display device according to claim 12, further comparing a planarization layer disposed between the light emitting element and the photoconversion layer.

20. The display device according to claim 12, wherein the light of the first wavelength band is blue light, the light of the second wavelength band is red light, and the light of the third wavelength band is green light.

* * * * *